US009207293B2

(12) United States Patent
Ando et al.

(10) Patent No.: US 9,207,293 B2
(45) Date of Patent: Dec. 8, 2015

(54) METHOD FOR MANUFACTURING A MAGNETIC SENSOR

(75) Inventors: Hideto Ando, Niigata-ken (JP); Shinji Sugihara, Niigata-ken (JP); Fumihito Koike, Niigata-ken (JP); Kota Asatsuma, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 855 days.

(21) Appl. No.: 13/466,887

(22) Filed: May 8, 2012

(65) Prior Publication Data
US 2012/0217962 A1    Aug. 30, 2012

Related U.S. Application Data

(63) Continuation of application No. PCT/JP2011/055187, filed on Mar. 7, 2011.

(30) Foreign Application Priority Data

Mar. 12, 2010    (JP) .................................. 2010-056158

(51) Int. Cl.
*G11B 5/127* (2006.01)
*H04R 31/00* (2006.01)
(Continued)

(52) U.S. Cl.
CPC ................ *G01R 33/093* (2013.01); *B82Y 25/00* (2013.01); *H01L 43/08* (2013.01); *H01L 43/12* (2013.01)

(58) Field of Classification Search
CPC .... G11B 5/1272; G11B 5/1278; G11B 5/187; G11B 5/2651; G11B 5/295; G11B 5/3116; G11B 5/3163; G11B 5/3929; G11B 5/3945; G11B 5/3967; B82Y 10/00; B82Y 25/00; G01B 7/30; G01R 33/02; G01R 33/09; G01R 33/093; G01R 33/098; Y10T 29/49032; Y10T 29/49043; Y10T 29/49044; Y10T 29/49046; Y10T 29/49048; Y10T 29/49053

USPC .............. 29/603.07, 603.13–603.16, 603.18; 324/244–253, 260–262
See application file for complete search history.

(56) References Cited

U.S. PATENT DOCUMENTS 8,054,067 B2 * 11/2011 Okada et al. ............. 324/207.21
8,093,886 B2 *  1/2012 Okada et al. ............. 324/207.21
(Continued)

FOREIGN PATENT DOCUMENTS

JP    2009-180604    8/2009
JP     2010-8160     1/2010

OTHER PUBLICATIONS

Notification of Reason for Refusal dated Sep. 3, 2013 from Japanese Patent Application No. 2012-504444.
(Continued)

*Primary Examiner* — Paul D Kim
(74) *Attorney, Agent, or Firm* — Beyer Law Group LLP

(57) ABSTRACT

A magnetic sensor having no sensitivity differences between sensitivity axes, and an easy manufacturing method therefor are provided. The method includes a process of forming first stacked films for a magnetoresistive element on a substrate. This element has a sensitivity axis in a certain direction and includes a self-pinned ferromagnetic pinned layer in which first and second ferromagnetic films are antiferromagnetically coupled through an antiparallel coupling layer, a nonmagnetic intermediate layer, and a soft magnetic free layer. The method further includes a process of removing a region of the first stacked films from the substrate. The remaining region of the films includes at least a region to be left to form the element. The method furthermore includes a process of forming second stacked films for a magnetoresistive element, which has a sensitivity axis in a direction different from the certain direction and has the same structure, on the exposed substrate.

3 Claims, 5 Drawing Sheets

(51) Int. Cl.
  *G01R 33/09* (2006.01)
  *B82Y 25/00* (2011.01)
  *H01L 43/08* (2006.01)
  *H01L 43/12* (2006.01)

(56) References Cited

U.S. PATENT DOCUMENTS 8,786,278 B2 * 7/2014 Ohta et al. .................... 324/247

2005/0140363 A1 * 6/2005 Grimm et al. ............ 324/207.21
2009/0189601 A1   7/2009 Okada et al.
2010/0079135 A1 * 4/2010 Ando et al. .............. 324/207.11

OTHER PUBLICATIONS

Search Report dated May 31, 2011 from International Application No. PCT/JP2011/055187.

* cited by examiner

METHOD FOR MANUFACTURING A MAGNETIC SENSOR

CLAIM OF PRIORITY

This application is a Continuation of International Application No. PCT/JP2011/055187 filed on Mar. 7, 2011, which claims benefit of Japanese Patent Application No. 2010-056158 filed on Mar. 12, 2010. The entire contents of each application noted above are hereby incorporated by reference.

BACKGROUND OF THE INVENTION

1. Field of the Invention

The present invention relates to a magnetic sensor using magnetoresistive elements, such as tunneling magnetoresistive (TMR) elements and giant magnetoresistive (GMR) elements, and a method for manufacturing the magnetic sensor.

2. Description of the Related Art

Heretofore, a magnetic sensor using magnetoresistive elements (GMR elements) which utilize a giant magnetoresistive effect is used as a magnetic sensor for a magnetic encoder for detecting a rotation direction and a rotation angle of a rotor such as a stepping motor. To cause this magnetic sensor to achieve a full 360° sensing capability, a sensor having a configuration in which magnetoresistive elements each have a corresponding one of magnetization directions that are different by 90° is disclosed in Japanese Unexamined Patent Application Publication No. 2009-180604.

As illustrated in FIG. 6, the magnetic sensor disclosed in Japanese Unexamined Patent Application Publication No. 2009-180604 has a configuration in which a magnetoresistive element 102a having a sensitivity axis in a certain direction is formed on a substrate 101 and a first layer is provided by forming an insulating layer 103 on top of the magnetoresistive element 102a. Similarly to the first layer, a second layer is provided by forming a magnetoresistive element 102b and an insulating layer 103, a third layer is provided by forming a magnetoresistive element 102c and an insulating layer 103, and a forth layer is provided by forming a magnetoresistive element 102d and an insulating layer 103. In this case, the magnetization directions of the magnetoresistive elements 102a to 102d are different by 90°.

However, in the magnetic sensor disclosed in Japanese Unexamined Patent Application Publication No. 2009-180604, magnetoresistive elements need to be formed in each layer. In addition, when the magnetoresistive elements 102a to 102d are stacked through the insulating layers 103, differences in height gradually appear by stacking one layer on top of another, causing an influence on the application state of a photoresist. Thus, to avoid the influence on the application state of a photoresist, the magnetoresistive elements need to be disposed separately from each other in plan view. Accordingly, it is not possible for the magnetoresistive elements to be manufactured close to each other, resulting in a constraint on reduction in the size of an element. Furthermore, since the positions in the height direction of the magnetoresistive elements 102a to 102d are different from each other in the magnetic sensor, for example, when a magnetic component is disposed in the upward direction of the plane of FIG. 6 with respect to the magnetic sensor, the distances from the magnetic component to the magnetoresistive elements 102a to 102d are different. Accordingly, sensitivity differences between sensitivity axes may be caused. Moreover, since the positions in the height direction of the magnetoresistive elements 102a to 102d are different from each other in the magnetic sensor, the magnetic sensor has a problem in that routing of wiring lines is difficult and additional processes such as a process of forming contact holes need to be performed, resulting in a complex manufacturing process.

SUMMARY OF THE INVENTION

The present invention is made in view of the above-described problems, and provides a magnetic sensor having no sensitivity differences between sensitivity axes, and a method for manufacturing such a magnetic sensor easily.

According to an aspect of the present invention, a magnetic sensor includes multiple magnetoresistive elements formed directly on an identical substrate. Each of the magnetoresistive elements includes a self-pinned ferromagnetic pinned layer in which a first ferromagnetic film and a second ferromagnetic film are coupled to each other through an antiparallel coupling layer in an antiferromagnetic manner, a nonmagnetic intermediate layer, and a soft magnetic free layer. The first ferromagnetic film and the second ferromagnetic film have substantially the same Curie temperature, and have a difference in magnetization amount of substantially zero. Magnetization directions of the ferromagnetic pinned layers in the magnetoresistive elements are different from each other, and the magnetoresistive elements are arranged on the substrate at the same height. A coercive force of a material of which the first ferromagnetic film is composed is equal to or more than 500 Oe, and a crystal structure of a material of which the second ferromagnetic film is composed is identical to a crystal structure of a material of which the nonmagnetic intermediate layer is composed.

According to this configuration, magnetoresistive elements having sensitivity axis directions that are different from each other can be formed on the same substrate so as to be disposed close to each other. Consequently, the positions in the height direction of the magnetoresistive elements (from the substrate) are not different from each other. As a result, a state in which no sensitivity differences between the sensitivity axes are present can be achieved. Furthermore, in the magnetic sensor according to the aspect of the present invention, no differences in height appear during the manufacturing of the magnetoresistive elements. Therefore, clearances that allow for differences in height between the magnetoresistive elements need not be provided between the magnetoresistive elements, enabling reduction in the size of a magnetic sensor. In addition, a magnetic sensor can be achieved in which no sensitivity differences between the sensitivity axes are present.

It is preferable that a coercive force of the material of which the second ferromagnetic film is composed be equal to or less than 50 Oe.

It is preferable that the first ferromagnetic film be composed of a CoFe alloy containing 40 to 80 atomic percent Fe, and the second ferromagnetic film be composed of a CoFe alloy containing 0 to 40 atomic percent Fe.

According to another aspect of the present invention, a method for manufacturing a magnetic sensor includes a first formation process, a removal process, and a second formation process. In the first formation process, a first stacked film set for a first magnetoresistive element is formed on a substrate. The first magnetoresistive element has a sensitivity axis in a certain direction and includes a self-pinned ferromagnetic pinned layer in which a first ferromagnetic film and a second ferromagnetic film are coupled to each other through an antiparallel coupling layer in an antiferromagnetic manner, a nonmagnetic intermediate layer, and a soft magnetic free layer. In the removal process, a region of the first stacked film set is removed from the substrate in such a manner that a remaining region of the first stacked film set is left behind. The remaining region includes at least a region that is to be left to form the first magnetoresistive element. In the second formation process, a second stacked film set for a second magnetoresistive element is formed in a region of the substrate in which the region of the first stacked film set has been removed. The second magnetoresistive element has a sensitivity axis in a direction that is different from the certain direction and includes a self-pinned ferromagnetic pinned layer in which a first ferromagnetic film and a second ferromagnetic film are coupled to each other through an antiparallel coupling layer in an antiferromagnetic manner, a nonmagnetic intermediate layer, and a soft magnetic free layer.

According to this method, since no differences in height are formed during the manufacturing of the magnetoresistive elements, wiring is easily formed and no additional processes, such as a process of making a wire thickness larger and a process of forming through holes, are necessary. Therefore, a magnetic sensor in which magnetoresistive elements having sensitivity axis directions that are different from each other are formed on the same substrate so as to be disposed close to each other can be easily manufactured.

It is preferable that while the first ferromagnetic film is being formed, a magnetic field be applied in a direction in which the magnetization of the ferromagnetic pinned layer is pinned.

It is preferable that the removal process and the second formation process be repeatedly performed in such a manner that magnetization directions of the ferromagnetic pinned layers in the stacked film sets are different from each other.

DESCRIPTION OF THE PREFERRED EMBODIMENTS

An embodiment of the present invention will be described in detail below with reference to the accompanying drawings.

Figure 1:
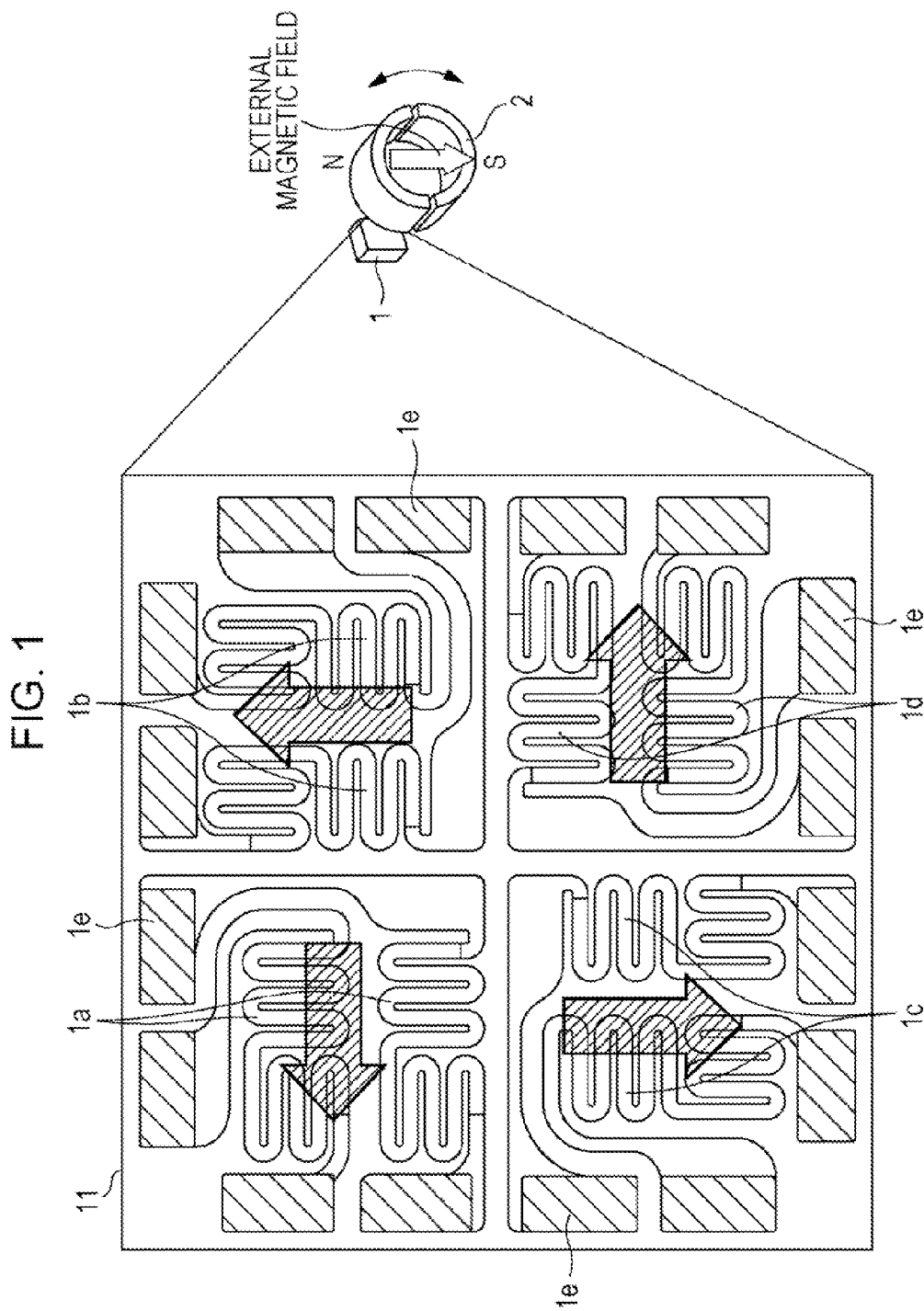
FIG. 1 is a diagram illustrating a magnetic sensor according to an embodiment of the present invention.

FIG. 1 is a diagram illustrating a magnetic sensor according to an embodiment of the present invention. A magnetic sensor 1 is used to detect a magnetic field of a magnet 2, for example, which is rotatable in the arrow direction as illustrated in FIG. 1 (that is, a magnetic encoder).

The magnetic sensor 1 illustrated in FIG. 1 includes four magnetoresistive elements 1a to 1d. The sensitivity axis direction of the magnetoresistive element 1a is the right-to-left direction of the plane of FIG. 1; that of the magnetoresistive element 1b is the down-to-up direction of the plane of FIG. 1; that of the magnetoresistive element 1c is the up-to-down direction of the plane of FIG. 1; and that of the magnetoresistive element 1d is the left-to-right direction of the plane of FIG. 1. All of these magnetoresistive elements 1a to 1d are formed directly on an identical substrate 11, and the positions in the height direction of the magnetoresistive elements 1a to 1d are substantially the same. That is, these magnetoresistive elements 1a to 1d are arranged on the substrate 11 at the same height. In FIG. 1, electrode pads 1e are illustrated.

Preferably, each of the magnetoresistive elements is a giant magnetoresistive (GMR) element having a meandering shape in which multiple long strip patterns (stripes) which are disposed so as to be parallel to each other in the longitudinal direction are connected at the ends with curved portions. The sensitivity axis direction (Pin direction) in this meandering shape is represented by the arrow direction.

Figure 2:
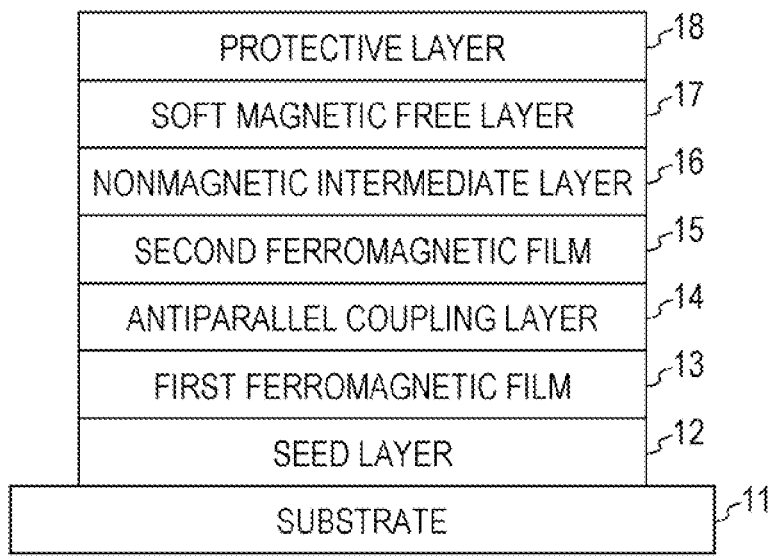
FIG. 2 is a diagram illustrating a film configuration of a magnetoresistive element of a magnetic sensor according to an embodiment of the present invention.

An exemplary film configuration of the magnetoresistive element is illustrated in FIG. 2. That is, the magnetoresistive element has a multilayer film structure provided on the substrate 11 as illustrated in FIG. 2. To simplify the description, an underlying layer and the like which are not included in the magnetoresistive element are not illustrated on the substrate 11 in FIG. 2. The magnetoresistive element includes a seed layer 12, a first ferromagnetic film 13, an antiparallel coupling layer 14, a second ferromagnetic film 15, a nonmagnetic intermediate layer 16, a soft magnetic free layer (magnetic free layer) 17, and a protective layer 18.

The seed layer 12 is composed of, for example, NiFeCr or Cr. The protective layer 18 is composed of, for example, Ta or Ru. In the above-described multilayer film structure, an underlying layer which is composed of a nonmagnetic material which is, for example, at least one element among Ta, Hf, Nb, Zr, Ti, Mo, and W may be provided between the substrate 11 and the seed layer 12.

In the magnetoresistive element, the first ferromagnetic film 13 and the second ferromagnetic film 15 are coupled to each other through the antiparallel coupling layer 14 in an antiferromagnetic manner, forming a so-called self-pinned ferromagnetic pinned layer, i.e. a synthetic ferri-pinned (SFP) layer.

In this ferromagnetic pinned layer, the antiparallel coupling layer 14 has a thickness of 0.3 to 0.45 nm or 0.75 to 0.95 nm, resulting in strong antiferromagnetic coupling between the first ferromagnetic film 13 and the second ferromagnetic film 15.

The first ferromagnetic film 13 and the second ferromagnetic film 15 have substantially the same magnetization amount (Ms·t). That is, the difference between the magnetization amounts of the first ferromagnetic film 13 and the second ferromagnetic film 15 is substantially zero. Accordingly, an effective anisotropy magnetic field in the SFP layer is large. Consequently, without using an antiferromagnetic material, magnetization stability for the ferromagnetic pinned layer (Pin layer) is sufficiently and surely achieved. This is because an effective anisotropy magnetic field in an SFP layer is expressed in Equation (1) as described below where t1 represents a film thickness of a first ferromagnetic film, t2 represents a film thickness of a second ferromagnetic film, and Ms and K represent a magnetization and an induced magnetic anisotropy constant of these films, respectively.

$$\mathit{eff}\,Hk = 2(K \cdot t_1 + K \cdot t_2)/(Ms \cdot t_1 - Ms \cdot t_2) \tag{1}$$

Therefore, the magnetoresistive element used in the magnetic sensor according to the embodiment of the present invention has a multilayer film configuration which includes no antiferromagnetic layers.

The Curie temperature (Tc) of the first ferromagnetic film 13 is substantially the same as that of the second ferromagnetic film 15. Thus, even in an environment of high temperature, the difference between the magnetization amounts (Ms·t) of the first and second ferromagnetic films 13 and 15 is substantially zero, achieving high magnetization stability.

Figure 3:
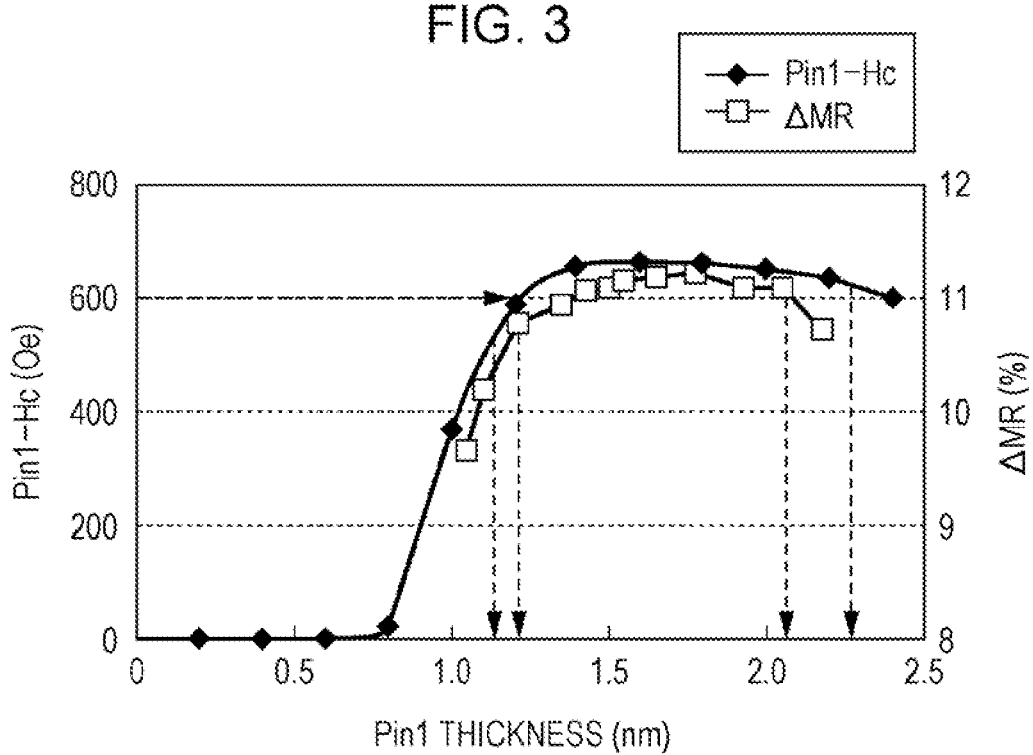
FIG. 3 is a graph showing the relationship between a film thickness of a first ferromagnetic film (Pin1), and a coercive force Hc and a ΔMR.

Preferably, a material of which the first ferromagnetic film 13 is composed has a great coercive force which is equal to or more than 500 Oe($\times 10^3/4\pi$ A/m), particularly, a coercive force which is equal to or more than 600 Oe. An investigation was made on the relationship between a film thickness of the first ferromagnetic film (Pin1), and a coercive force Hc and a $\Delta$MR. The results are shown in FIG. 3. The film configuration used for checking a property of the first ferromagnetic film was as follows: a substrate; NiFeCr (seed layer: 4 nm); $Fe_{60}Co_{40}$ (first ferromagnetic film: X); Ru (antiparallel coupling layer: 0.4 nm); Cu (nonmagnetic intermediate layer: 2 nm); and Ta (protective layer: 5 nm). The film configuration used for checking the $\Delta$MR was as follows: NiFeCr (seed layer: 4 nm); $Fe_{60}Co_{40}$ (first ferromagnetic film: X); Ru (antiparallel coupling layer: 0.4 nm); $Co_{90}Fe_{10}$ (second ferromagnetic film: optimization); Cu (nonmagnetic intermediate layer: 2 nm); $Co_{90}Fe_{10}$ (soft magnetic free layer: 1 nm); NiFe (soft magnetic free layer: 2 nm); and Ta (protective layer: 5 nm).

As understandable from FIG. 3, as the thickness of the first ferromagnetic film 13 is increased, the coercive force of the first ferromagnetic film 13 increases, so that the $\Delta$MR increases and saturation stabilization is achieved. Therefore, it is preferable that the coercive force of the first ferromagnetic film 13 to obtain a stable $\Delta$MR be at least 500 Oe, preferably, equal to or more than 600 Oe.

A material of which the second ferromagnetic film 15 is composed preferably has a small coercive force of 50 Oe or less. The material of which the second ferromagnetic film 15 is composed preferably has the same crystal structure as that of a material of which the nonmagnetic intermediate layer is composed. For example, when the material of which the nonmagnetic intermediate layer is composed is Cu, the material of which the second ferromagnetic film 15 is composed preferably has a crystal structure of face-centered cubic lattice (fcc). The setting of the materials described above causes the magnetization direction of the first ferromagnetic film 13 which has a great coercive force to be dominant.

Preferably, the first ferromagnetic film 13 is composed of a CoFe alloy containing 40 to 80 atomic percent Fe. This is because a CoFe alloy having this composition range has a great coercive force and causes the magnetization to be kept stable against the external magnetic field. The second ferromagnetic film 15 is preferably composed of a CoFe alloy containing 0 to 40 atomic percent Fe. This is because a CoFe alloy having this composition range has a small coercive force and causes the magnetization to be easily oriented in the antiparallel direction (a direction obtained by being rotated 180°) with respect to the dominant magnetization direction of the first ferromagnetic film 13. As a result, Hk in the above-described Equation (1) can be made larger. In addition, by limiting the composition range of the second ferromagnetic film 15 to the above-described composition range, the resistance variation rate of the magnetoresistive element can be made larger.

Preferably, a magnetic field is applied to the first ferromagnetic film 13 and the second ferromagnetic film 15 in the width direction of the stripes in a meander shape while the first ferromagnetic film 13 and the second ferromagnetic film 15 are being formed, and induced magnetic anisotropy is added to the formed first ferromagnetic film 13 and the formed second ferromagnetic film 15. This causes the first and second ferromagnetic films 13 and 15 to be magnetized in the stripe width directions that are antiparallel to each other. Since the magnetization directions (directions in which the magnetization is pinned) of the first ferromagnetic film 13 and the second ferromagnetic film 15 are dependent on the direction of a magnetic field that is applied while the first ferromagnetic film 13 is being formed, multiple magnetoresistive elements each of which has a corresponding one of ferromagnetic pinned layers having different magnetization directions can be formed on the same substrate by varying the applied magnetic field direction of the first ferromagnetic film 13 while the first ferromagnetic film 13 is being formed.

Desirably, a magnetic field used to pin the magnetization of the ferromagnetic pinned layer is, for example, equal to or more than 60 Oe. In particular, to reduce the variation in the characteristic of the elements in the substrate, a permanent magnet or an electromagnet that has a magnetic field angle distribution within ±1 deg is desirably used.

The antiparallel coupling layer 14 in the ferromagnetic pinned layer is composed of, for example, Ru. The soft magnetic free layer (magnetic free layer) 17 is composed of a magnetic material, such as a CoFe alloy, a NiFe alloy, or a CoFeNi alloy. The nonmagnetic intermediate layer 16 is composed of, for example, Cu. Preferably, a magnetic field is applied to the soft magnetic free layer 17 in the longitudinal direction of the stripes in a meander shape while the soft magnetic free layer 17 is being formed, and induced magnetic anisotropy is added to the formed soft magnetic free layer 17. Accordingly, in the magnetoresistive element, the resistance linearly changes with respect to the external magnetic field in the stripe width direction, resulting in small hysteresis. In this magnetoresistive element, the ferromagnetic pinned layer, the nonmagnetic intermediate layer, and the soft magnetic free layer form a spin valve structure.

An exemplary film configuration of the magnetoresistive element used in the magnetic sensor according to the embodiment of the present invention is as follows: NiFeCr (seed layer: 4 nm); Fe60Co40 (first ferromagnetic film: 2.1 nm); Ru (antiparallel coupling layer: 0.4 nm); Co90Fe10 (second ferromagnetic film: 2 nm); Cu (nonmagnetic intermediate layer: 2.2 nm); Co90Fe10 (soft magnetic free layer: 1 nm); Ni82Fe18 (soft magnetic free layer: 4 nm); and Ta (protective layer: 5 nm).

In the above-described magnetic sensor, magnetoresistive elements having sensitivity axis directions that are different from each other can be formed on the same substrate so as to be disposed close to each other. Consequently, the positions in the height direction of the magnetoresistive elements (from the substrate) are not different from each other. Accordingly, as illustrated in FIG. 1, when the magnetic sensor 1 is disposed so as to be opposite the magnet 2, the distances from each of the magnetoresistive elements 1a to 1d to the magnet 2 are substantially the same. As a result, a state in which no sensitivity differences between the sensitivity axes are present can be achieved. Furthermore, in the magnetic sensor according to the embodiment of the present invention, no differences in height are formed during the manufacturing of the magnetoresistive elements. Therefore, clearances that allow for differences in height between the magnetoresistive elements need not be provided between the magnetoresistive elements, resulting in reduction in the size of a magnetic sensor.

When a magnetoresistive element is used in which the magnetization of a magnetic pinned layer is pinned using an antiferromagnetic film, the blocking temperature (the temperature at which an exchange coupling magnetic field disappears) of the antiferromagnetic material is about 300 to 400° C., and an exchange coupling magnetic field gradually decreases toward this temperature. Therefore, as the temperature becomes higher, the characteristic of the magnetic pinned layer becomes more unstable. Since the magnetic sensor according to the embodiment of the present invention uses no antiferromagnetic films, the characteristic of the magnetic pinned layer is mainly dependent on the Curie temperature of the ferromagnetic material of which the magnetic pinned layer is composed. In general, the Curie temperature of a ferromagnetic material such as CoFe is considerably higher than the blocking temperature of an antiferromagnetic material. Therefore, even when the Curie temperatures of ferromagnetic materials of which the first ferromagnetic film and the second ferromagnetic film are composed are made the same and these films are placed in a high-temperature region, high magnetization stability can be kept by keeping the difference between the magnetization amounts (Ms·t) at zero.

When a magnetoresistive element is used in which the magnetization of a magnetic pinned layer is pinned using an antiferromagnetic film, an exchange coupling magnetic field appears in the direction of a magnetic field applied during annealing. Accordingly, a difference between the magnetization amounts (Ms·t) of the first ferromagnetic film and the second ferromagnetic film needs to be intentionally provided. This is because when the difference between the magnetization amounts is zero, a magnetic field in which the first ferromagnetic film and the second ferromagnetic film are both saturated exceeds a magnetic field which can be applied during annealing (up to 15 kOe), whereby magnetization dispersion of the first ferromagnetic film and the second ferromagnetic film after annealing increases, resulting in degradation in ΔR/R. To increase ΔR/R, the second ferromagnetic film is often formed so as to have a film thickness larger than that of the first ferromagnetic film (i.e., to have a larger magnetization amount). In general, when the second ferromagnetic film has a magnetization amount larger than that of the first ferromagnetic film, a larger circulating magnetic field is applied from the second ferromagnetic film to the soft magnetic free layer at element side walls, and an influence on asymmetry of output becomes larger. In addition, the circulating magnetic field is significantly dependent on temperature, so that the asymmetry is significantly dependent on temperature. In the magnetic sensor according to the embodiment of the present invention, the difference between the magnetization amounts of the first ferromagnetic film and the second ferromagnetic film of the magnetoresistive element is zero, so that such a problem can be also solved.

The magnetoresistive elements in the magnetic sensor according to the embodiment of the present invention contain no antiferromagnetic materials, so that the material cost and manufacturing cost can be also reduced.

In the method for manufacturing a magnetic sensor according to the embodiment of the present invention, a first stacked film set for a magnetoresistive element is formed on a substrate (first formation process). This magnetoresistive element has a sensitivity axis in a certain direction and includes a self-pinned ferromagnetic pinned layer in which a first ferromagnetic film and a second ferromagnetic film are coupled to each other through an antiparallel coupling layer in an antiferromagnetic manner, a nonmagnetic intermediate layer, and a soft magnetic free layer. A region of the first stacked film set is removed from the substrate in such a manner that a remaining region of the first stacked film set is left behind (removal process). The remaining region includes at least a region that is to be left to form the magnetoresistive element. A second stacked film set for a different magnetoresistive element is formed in a region of the substrate in which the region of the first stacked film set has been removed (second formation process). This different magnetoresistive element has a sensitivity axis in a direction that is different from the certain direction and includes a self-pinned ferromagnetic pinned layer in which a first ferromagnetic film and a second ferromagnetic film are coupled to each other through an antiparallel coupling layer in an antiferromagnetic manner, a nonmagnetic intermediate layer, and a soft magnetic free layer. Thus, magnetoresistive elements each of which has a corresponding one of ferromagnetic pinned layers that have different magnetization directions can be disposed close to each other on the same substrate. In addition, the removal process and the second formation process described above are repeatedly performed, whereby magnetoresistive elements each of which has a corresponding one of ferromagnetic pinned layers that have different magnetization directions can be disposed close to each other on the same substrate.

Figure 4A:
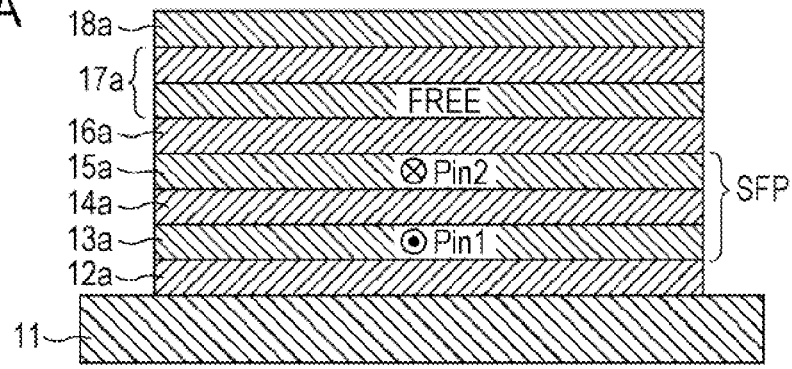
FIGS. 4A to 4C are diagrams for explaining a manufacturing process of a magnetic sensor according to an embodiment of the present invention.

FIGS. 4A to 4C and 5A to 5C are diagrams for explaining a process of manufacturing the magnetoresistive elements in the magnetic sensor according to the embodiment of the present invention. As illustrated in FIG. 4A, a seed layer 12a, a first ferromagnetic film 13a, an antiparallel coupling layer 14a, a second ferromagnetic film 15a, a nonmagnetic intermediate layer 16a, soft magnetic free layers (magnetic free layers) 17a, and a protective layer 18a are formed on the substrate 11 in this sequence. While the first ferromagnetic film 13a and the second ferromagnetic film 15a are being formed, a magnetic field is applied in the width direction of the stripes in a meander shape. In FIG. 4A, the applied magnetic field direction for the first ferromagnetic film 13a is the background-to-foreground direction perpendicular to the plane of FIG. 4A, and that for the second ferromagnetic film 15a is the foreground-to-background direction perpendicular to the plane of FIG. 4A. However, it is not necessary to apply a magnetic field to the second ferromagnetic film 15a in this direction. The magnetization direction may be the same as that of the first ferromagnetic film 13a, or no magnetic fields may be applied to the second ferromagnetic film 15a. This is because exchange coupling acts through the antiparallel coupling layer 14a, and a certain magnetization direction is surely determined due to the first ferromagnetic film 13a and the antiparallel coupling layer 14a. In this case, the optimization of the film thickness of the antiparallel coupling layer 14a and the magnetization amounts Ms·t of the first ferromagnetic film 13a and the second ferromagnetic film 15a which are set so as to be the same are important. While the soft magnetic free layers (magnetic free layers) 17a are being formed, a magnetic field is applied in the longitudinal direction of the stripes in a meander shape.

Figure 4B:
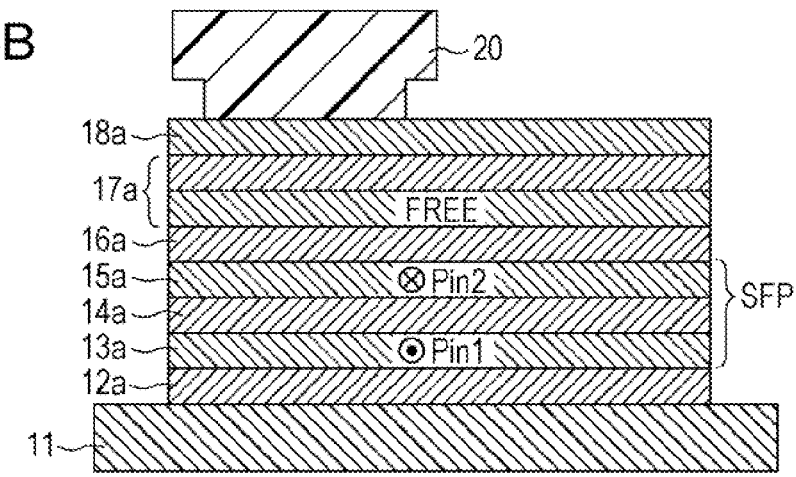
Figure 4C:
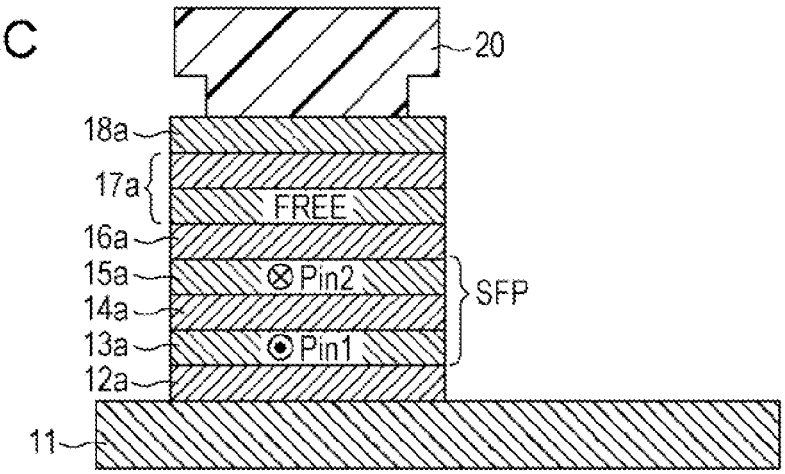

Then, as illustrated in FIG. 4B, a resist layer 20 is formed on the protective layer 18a, and the resist layer 20 is formed so as to be left behind in a region on the side of the magnetoresistive element 1a by photolithography and etching. Then, as illustrated in FIG. 4C, exposed stacked films are removed by, for example, ion milling so that a region of the substrate 11 in which the magnetoresistive elements 1b, 1c, and 1d are to be formed is exposed.

Figure 5A:
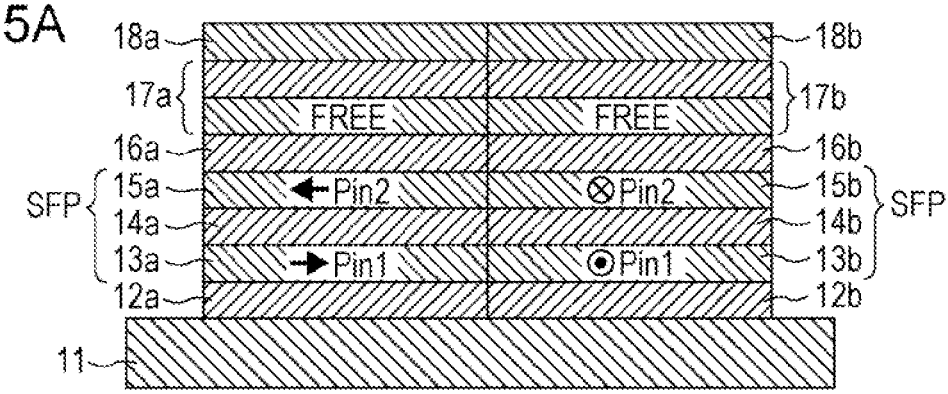
FIGS. 5A to 5C are diagrams for explaining a manufacturing process of a magnetic sensor according to an embodiment of the present invention.

As illustrated in FIG. 5A, a seed layer 12b, a first ferromagnetic film 13b, an antiparallel coupling layer 14b, a second ferromagnetic film 15b, a nonmagnetic intermediate layer 16b, soft magnetic free layers (magnetic free layers) 17b, and a protective layer 18b are formed in the exposed region of the substrate 11 in this sequence. While the first ferromagnetic film 13b and the second ferromagnetic film 15b are being formed, a magnetic field is applied in the width direction of the stripes in a meander shape. In FIG. 5A, the applied magnetic field direction for the first ferromagnetic film 13b is the background-to-foreground direction perpendicular to the plane of FIG. 5A, and that for the second ferromagnetic film 15b is the foreground-to-background direction perpendicular to the plane of FIG. 5A. While the soft magnetic free layers (magnetic free layers) 17b are being formed, a magnetic field is applied in the longitudinal direction of the stripes in a meander shape.

Figure 5B:
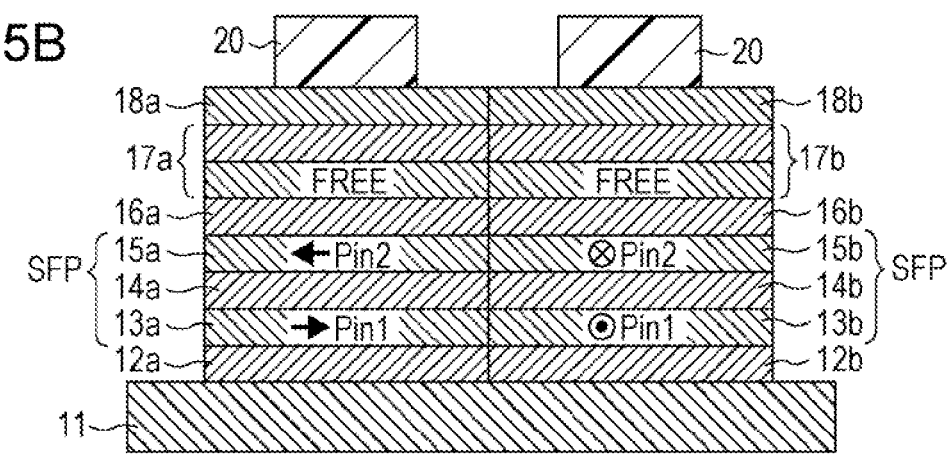
Figure 5C:
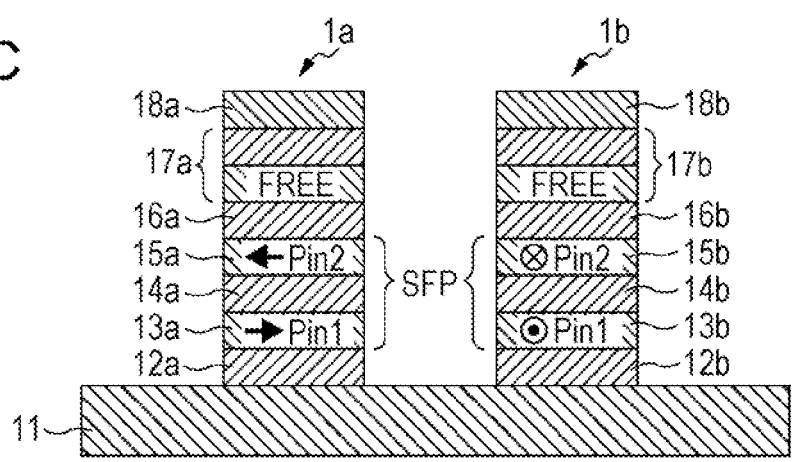
Figure 6:
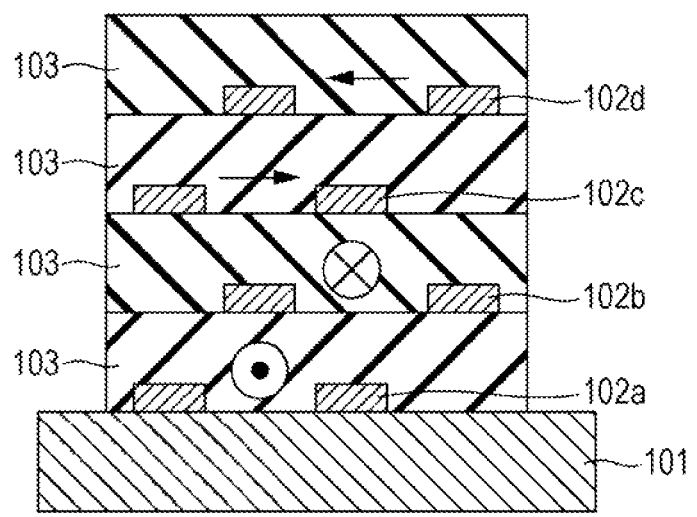
FIG. 6 is a diagram for explaining a magnetic sensor of related art.

Then, as illustrated in FIG. 5B, a resist layer is formed on the protective layers 18a and 18b, and resist layers 20 are formed so as to be left behind in regions on the side of the magnetoresistive elements 1a and 1b by photolithography and etching. Then, as illustrated in FIG. 5C, exposed stacked films are removed by, for example, ion milling so that the magnetoresistive elements 1a and 1b are formed and regions of the substrate 11 in which the magnetoresistive elements 1c and 1d are to be formed are exposed. Similarly, stacked layers from a seed layer to a protective layer are formed in regions in which the magnetoresistive elements 1c and 1d are to be formed. Thus, the magnetoresistive elements 1a, 1b, 1c, and 1d are formed on the substrate 11 in the arrangement as illustrated in FIG. 1.

According to the method for manufacturing a magnetic sensor, since no differences in height are formed during the manufacturing of the magnetoresistive elements, wiring is easily formed and no additional processes, such as a process of making a wire thickness larger and a process of forming through holes, are necessary. Therefore, a magnetic sensor can be easily manufactured in which magnetoresistive elements having sensitivity axis directions that are different from each other are formed on the same substrate so as to be disposed close to each other.

The present invention is not limited to the above-described embodiment and various modifications may be made to the embodiment. For example, the materials, the relation of connection between elements, the thickness, the size, and the manufacturing method according to the embodiment may be changed as appropriate and used in a modified embodiment. Other than these, the present invention may be modified as appropriate and carried out without departing from the scope of the present invention.

What is claimed is:

1. A method for manufacturing a magnetic sensor, the method comprising:
    forming a first stack of films on a substrate for a first magnetoresistive element having a sensitivity axis in a first direction, the first stack of films including:
        a self-pinned ferromagnetic pinned layer formed of a first ferromagnetic film, a second ferromagnetic film, and an antiparallel coupling layer interposed therebetween, the first and second ferromagnetic films being antiferromagnetically coupled to each other via the antiparallel coupling layer;
        a nonmagnetic intermediate layer, and
        a soft magnetic free layer;
    removing a part of the first stack of films from a certain region of the substrate such that a remaining region of the first stack of films includes at least a predetermined region in which the first magnetoresistive element is to be formed; and
    forming a second stack of films for a second magnetoresistive element in the certain region of the substrate where the part of the first stack of films has been removed, the second magnetoresistive element having a sensitivity axis in a second direction that is different from the first direction, and including:
        a self-pinned ferromagnetic pinned layer formed of a first ferromagnetic film, a second ferromagnetic film, and an antiparallel coupling layer interposed therebetween, the first and second ferromagnetic films being antiferromagnetically coupled to each other via the antiparallel coupling layer;
        a nonmagnetic intermediate layer, and
        a soft magnetic free layer.

2. The method according to claim 1, further comprising:
    while the first ferromagnetic film is being formed during the forming of the first stack of films and during the forming of the second stack of films, applying a magnetic field in a direction of pinning the magnetization of the ferromagnetic pinned layer.

3. The method according to claim 1, further comprising:
    removing a part of the first stack of films and the second stack of films from a second certain region of the substrate, and forming a third stack of films and a fourth stack of films in the second certain region of the substrate, by changing a magnetization direction of a respective ferromagnetic pinned layer in the third stack of films and the fourth stack of films such that the magnetization directions in the first stack of films, the second stack of films, the third stack of films, and the fourth stack of films are different from one another.

* * * * *